United States Patent
Lin et al.

(10) Patent No.: US 9,159,626 B2
(45) Date of Patent: Oct. 13, 2015

(54) FINFET AND FABRICATING METHOD THEREOF

(75) Inventors: Chien-Ting Lin, Hsinchu (TW); Wen-Tai Chiang, Tainan (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 78 days.

(21) Appl. No.: 13/418,367

(22) Filed: Mar. 13, 2012

(65) Prior Publication Data

US 2013/0241003 A1    Sep. 19, 2013

(51) Int. Cl.
| | |
|---|---|
| H01L 27/088 | (2006.01) |
| H01L 21/326 | (2006.01) |
| H01L 21/8234 | (2006.01) |
| H01L 21/8238 | (2006.01) |
| H01L 21/28 | (2006.01) |
| H01L 29/51 | (2006.01) |
| H01L 29/66 | (2006.01) |

(52) U.S. Cl.
CPC .. *H01L 21/823431* (2013.01); *H01L 21/28088* (2013.01); *H01L 21/82345* (2013.01); *H01L 21/823821* (2013.01); *H01L 21/823842* (2013.01); *H01L 29/517* (2013.01); *H01L 29/66545* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66

USPC ......... 257/288, 347, 392, 365, 335, 296, 401, 257/412
See application file for complete search history.

(56) References Cited

U.S. PATENT DOCUMENTS

| | | | |
|---|---|---|---|
| 6,043,138 | A | 3/2000 | Ibok |
| 6,492,216 | B1 | 12/2002 | Yeo |
| 6,921,963 | B2 | 7/2005 | Krivokapic |
| 7,087,477 | B2 | 8/2006 | Fried |
| 7,091,551 | B1 | 8/2006 | Anderson |
| 7,247,887 | B2 | 7/2007 | King |
| 7,250,658 | B2 | 7/2007 | Doris |
| 7,309,626 | B2 | 12/2007 | Ieong |
| 7,352,034 | B2 | 4/2008 | Booth, Jr. |
| 7,354,832 | B2 | 4/2008 | Rachmady |
| 7,470,570 | B2 | 12/2008 | Beintner |
| 7,531,437 | B2 | 5/2009 | Brask |
| 7,569,857 | B2 | 8/2009 | Simon |
| 2004/0195624 | A1 | 10/2004 | Liu |
| 2005/0051825 | A1 | 3/2005 | Fujiwara |
| 2006/0099830 | A1 | 5/2006 | Walther |
| 2006/0286729 | A1 | 12/2006 | Kavalieros |
| 2007/0052037 | A1* | 3/2007 | Luan .......................... 257/369 |

(Continued)

*Primary Examiner* — Robert Bachner
*Assistant Examiner* — Moin Rahman
(74) *Attorney, Agent, or Firm* — Winston Hsu; Scott Margo (57) ABSTRACT

A fin-shaped field-effect transistor process includes the following steps. A substrate is provided. A first fin-shaped field-effect transistor and a second fin-shaped field-effect transistor are formed on the substrate, wherein the first fin-shaped field-effect transistor includes a first metal layer and the second fin-shaped field-effect transistor includes a second metal layer. A treatment process is performed on the first fin-shaped field-effect transistor to adjust the threshold voltage of the first fin-shaped field-effect transistor. A fin-shaped field-effect transistor formed by said process is also provided.

10 Claims, 5 Drawing Sheets

(56) References Cited

U.S. PATENT DOCUMENTS

| | | |
|---|---|---|
| 2007/0075351 A1* | 4/2007 | Schulz et al. ............... 257/314 |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0261423 A1* | 10/2009 | Sawada ........................ 257/392 |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0068414 A1* | 3/2011 | Anderson et al. ............ 257/401 |
| 2011/0284966 A1* | 11/2011 | Wen et al. .................... 257/368 |
| 2013/0221445 A1* | 8/2013 | Lei et al. ....................... 257/368 |

* cited by examiner

FINFET AND FABRICATING METHOD THEREOF

BACKGROUND OF THE INVENTION

1. Field of the Invention

The present invention relates generally to a fin-shaped field-effect transistor (FinFET) and a fabricating process thereof, and more specifically to a fin-shaped field-effect transistor (FinFET) and a fabricating process thereof, that changes some chemical or physical properties of metal layers of the field-effect transistor by performing a treatment process.

2. Description of the Prior Art

Poly-silicon is conventionally used as a gate electrode in semiconductor devices, such as the metal-oxide-semiconductor (MOS). However, with the trend towards scaling down the size of semiconductor devices, the conventional poly-silicon gates face problems such as lower performances due to boron penetration and unavoidable depletion effect, which increases the equivalent thickness of the gate dielectric layer, reduces the gate capacitance, and worsens the driving force of the devices. Therefore, work function metals that are suitable to serve as high-K gate dielectric layers are used to replace the conventional poly-silicon gate to be the control electrode.

The size and properties requirements for the semiconductor components become more demanding as the semiconductor component dimensions shrink. Because of limitations in processes, material properties and sizes, it is difficult to improve the electrical properties of the semiconductor component, such as the threshold voltage of a metal gate of the semiconductor component, to achieve the purposes of the semiconductor component.

SUMMARY OF THE INVENTION

The present invention provides a fin-shaped field-effect transistor (FinFET) and a process thereof, which performs a treatment process to change physical properties and chemical properties of at least a metal layer of the transistor to improve the electrical performances, such as the threshold voltage of the transistor.

The present invention provides a fin-shaped field-effect transistor (FinFET) process including the following steps. A substrate is provided. A first fin-shaped field-effect transistor and a second fin-shaped field-effect transistor are formed on the substrate, wherein the first fin-shaped field-effect transistor includes a first metal layer and the second fin-shaped field-effect transistor includes a second metal layer. A treatment process is performed on the first metal layer to adjust the threshold voltage of the first fin-shaped field-effect transistor.

The present invention provides a field-effect transistor including a first fin-shaped field-effect transistor and a second fin-shaped field-effect transistor with the same conductivity type located on a substrate. The first fin-shaped field-effect transistor comprises a first metal layer and the second fin-shaped field-effect transistor comprises a second metal layer. The first metal layer and the second metal layer are of the same materials but different thicknesses.

The present invention provides a field-effect transistor including a first fin-shaped field-effect transistor and a second fin-shaped field-effect transistor having the same conductivity type located on a substrate. The first fin-shaped field-effect transistor comprises a first metal layer, and the second fin-shaped field-effect transistor comprises a second metal layer. The first metal layer and the second metal layer are of different materials.

According to the above, the present invention provides a fin-shaped field-effect transistor and a process thereof, which performs a treatment process on at least one of two or more than two fin-shaped field-effect transistors, in order to change some of the physical or chemical properties of at least a metal layer in each fin-shaped field-effect transistor. Thus, electrical properties, such as the threshold voltage, of at least one of the fin-shaped field-effect transistors can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
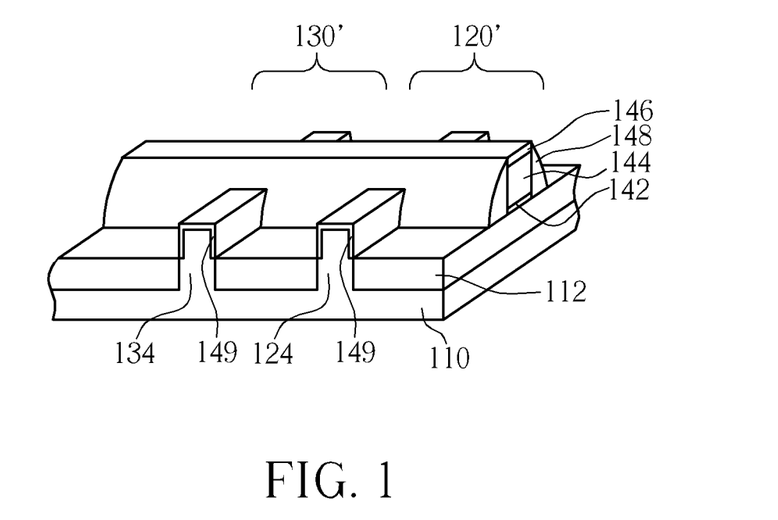
FIGS. 1-2 schematically depict three dimensional diagrams of a fin-shaped field-effect transistor process according to one embodiment of the present invention.
Figure 2:
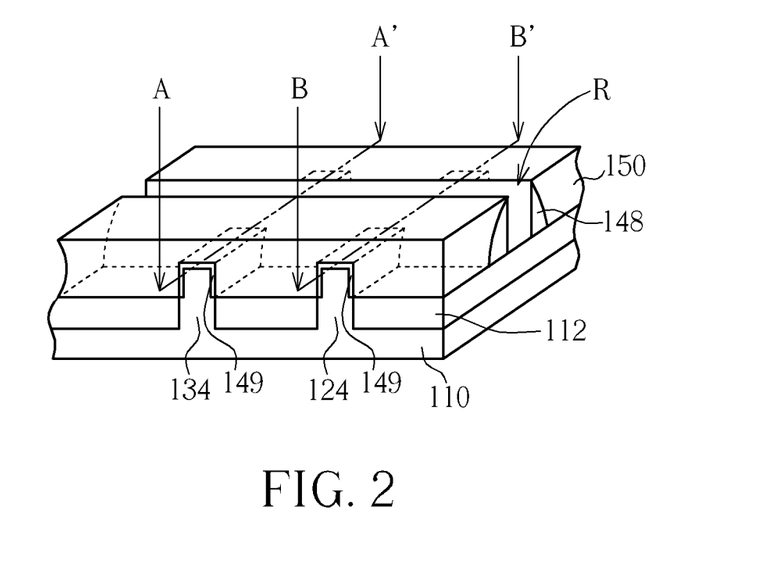

FIGS. 1-2 schematically depict three dimensional diagrams of a fin-shaped field-effect transistor process according to one embodiment of the present invention. As shown in FIG. 1, a substrate 110 is provided. A first fin-shaped field-effect transistor 120' and a second fin-shaped field-effect transistor 130' are formed on the substrate 110. More precisely, the method of forming the first fin-shaped field-effect transistor 120' and the second fin-shaped field-effect transistor 130' includes the following steps. A bulk substrate (not shown) is provided. A hard mask (not shown) is formed thereon. The hard mask (not shown) is patterned to define the locations of the first fin-shaped structure 124 for forming the first fin-shaped field-effect transistor 120' and the second fin-shaped structure 134 for forming the second fin-shaped field-effect transistor 130' in the substrate 110. An etching process is performed on the bulk substrate (not shown) so that the first fin-shaped structure 124 and the second fin-shaped structure 134 are formed. The fabrication of the first fin-shaped structure 124 and the second fin-shaped structure 134 on the substrate 110 is then finished.

An isolation structure 112 is formed on the substrate 110 between the first fin-shaped structure 124 and the second fin-shaped structure 134. The isolation structure 112 may be a shallow trench isolation structure, but it is not limited thereto. In one embodiment, the hard mask (not shown) is removed after the first fin-shaped structure 124 and the second fin-shaped structure 134 are formed, and a tri-gate MOSFET can be formed in the following processes. There are three contact faces between the first fin-shaped structure 124 and a later formed dielectric layer, and between the second fin-shaped structure 134 and the later formed dielectric layer, used as a carrier channel whose width is wider than a channel width of a conventional planar MOSFET. When a driving voltage is applied, the tri-gate MOSFET produces an on-current twice higher compared to the conventional planar MOSFET. In another embodiment, the hard mask layer (not shown) is reserved to form another kind of multi-gate MOSFET. Due to the hard mask layer (not shown) being reserved, there are only two contact faces between the first fin-shaped structure 124 and a later formed dielectric layer, and between the second fin-shaped structure 134 and the later formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched until an oxide layer being a middle part of the silicon-on-insulator substrate (not shown) is exposed, meaning that the fin-shaped structure formed on the silicon-on-insulator substrate (not shown) is finished.

For clarifying the present invention, only the first fin-shaped structure 124 and the second fin-shaped structure 134 are depicted in this embodiment, but the present invention can also be applied to a plurality of fin-shaped structures in the first fin-shaped field-effect transistor 120' and the second fin-shaped field-effect transistor 130'.

After the first fin-shaped structure 124 and the second fin-shaped structure 134 are formed, a dielectric layer (not shown), an electrode layer (not shown) and a cap layer (not shown) are formed across the first fin-shaped structure 124 and the second fin-shaped structure 134 and then three of them are patterned to form a dielectric layer 142, an electrode layer 144 and a cap layer 146. A spacer 148 is formed beside the dielectric layer 142, the electrode layer 144 and the cap layer 146. The dielectric layer 142 may be an oxide layer; the electrode layer 144 may be a polysilicon layer; the cap layer 146 may be a nitride layer, but they are not limited thereto. A source/drain region 149 may be respectively formed on the first fin-shaped structure 124 and the second fin-shaped structure 134 beside the spacer 148 by methods such as an inclination ion implantation process. Thus, the fabrication of the first fin-shaped field-effect transistor 120' and the second fin-shaped field-effect transistor 130' is finished. At this time, the first fin-shaped field-effect transistor 120' and the second fin-shaped field-effect transistor 130' have polysilicon electrode gates but they will be replaced by metal gates in subsequent processes. In another way, the present invention can also be applied to a gate-first process, and the electrode layer 144 is therefore formed with suitable metal material layer/layers in combination with a polysilicon layer.

As shown in FIG. 2, an interdielectric layer (not shown) is formed and covers the substrate 110, the first fin-shaped structure 124, the second fin-shaped structure 134, the spacer 148 and the cap layer 146. Then, the interdielectric layer (not shown) is planarized to form an interdielectric layer 150. The planarization process may include a chemical mechanical polishing (CMP) process or an etching process, but not limited to. AS the planarization process is performed, the cap layer 146 is also removed to expose the electrode layer 144. Then, the electrode layer 144 is removed and a recess R is thereby formed. In following processes, metal materials will be filled into the recess R on the first fin-shaped structure 124 and the second fin-shaped structure 134 to form a first fin-shaped field-effect transistor 120 and a second fin-shaped field-effect transistor 130 respectively. The first fin-shaped field-effect transistor 120 and the second fin-shaped field-effect transistor 130 may include common or different metal layers. For clarifying the structures of the first fin-shaped field-effect transistor 120 and the second fin-shaped field-effect transistor 130, FIGS. 3-10 schematically depict cross-sectional views of the first fin-shaped field-effect transistor 120 and the second fin-shaped field-effect transistor 130 along an AA' section line and a BB' section line of FIG. 2.

Figure 3:
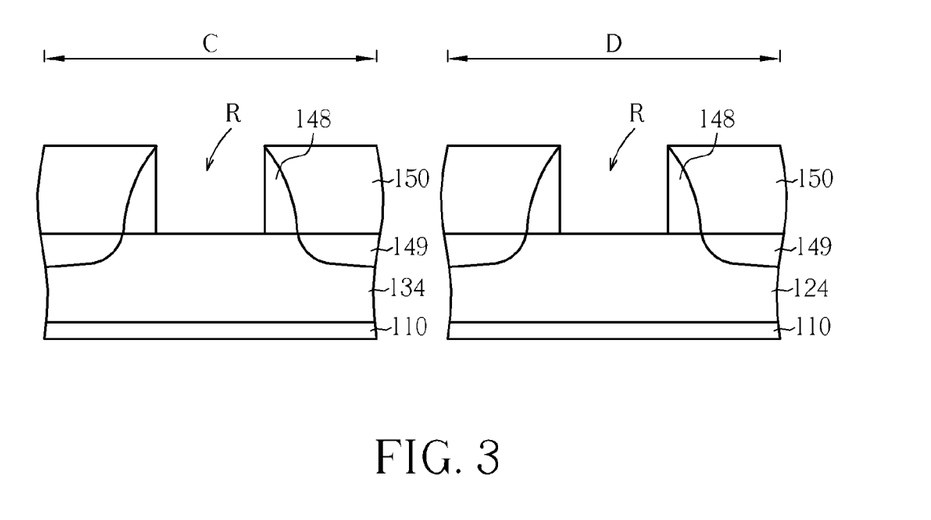
FIGS. 3-10 schematically depict cross-sectional views of a fin-shaped field-effect transistor process alone AA' sectional line and BB' sectional line of FIG. 2.

As shown in FIG. 3, the spacer 148 and the interdielectric layer 150 are respectively formed across the first fin-shaped structure 124 and the second fin-shaped structure 134. The source/drain region 149 is formed in the first fin-shaped structure 124 and the second fin-shaped structure 134 beside the spacer 148. The spacer 148 surrounds a recess R, which exposes parts of the first fin-shaped structure 124 and the second fin-shaped structure 134. More precisely, along the AA' section line of FIG. 2 is shown the first fin-shaped field-effect transistor 120 will be formed on the first fin-shaped structure 124, and an area C corresponds to the area desired to form the first fin-shaped field-effect transistor 120 on; along BB' section line of FIG. 2 is shown the second fin-shaped field-effect transistor 130 will be formed on the second fin-shaped structure 134, and an area D corresponds to the area desired to form the first fin-shaped field-effect transistor 130 on.

Figure 4:
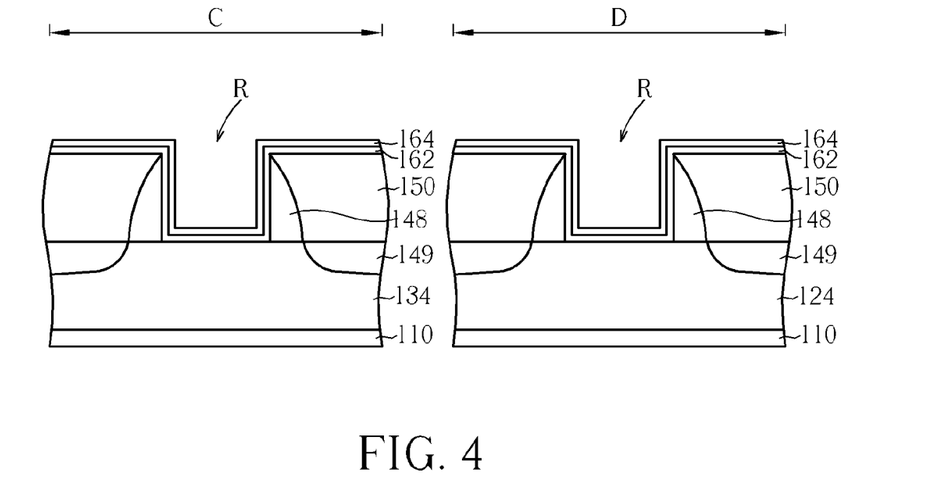

As shown in FIG. 4, a buffer layer 162 and a dielectric layer 164 are sequentially formed on the first fin-shaped structure 124 and the second fin-shaped structure 134. The buffer layer 162 may be an oxide layer, and the dielectric layer 164 may be a dielectric layer having a high dielectric constant, such as the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST).

Figure 5:
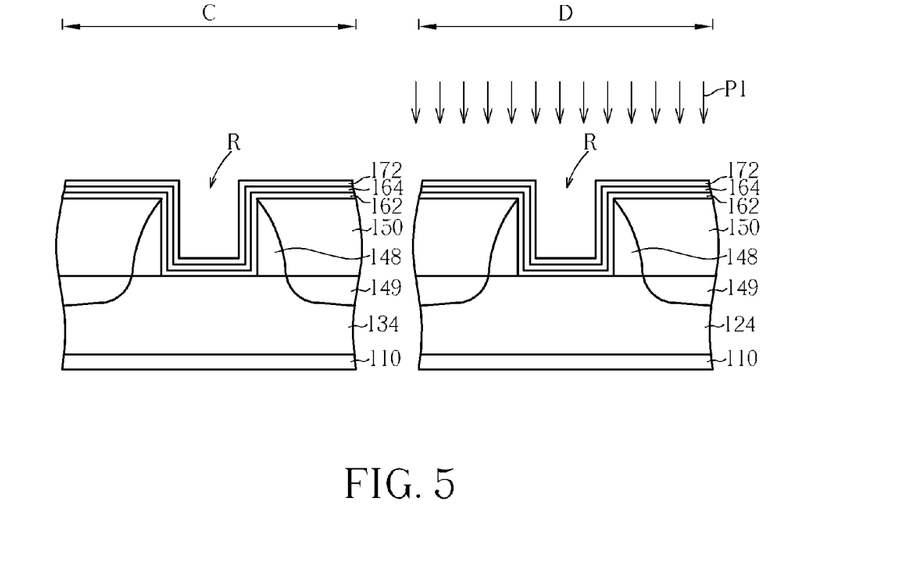

As shown in FIG. 5, a bottom barrier layer 172 is formed on the dielectric layer 164, wherein the bottom barrier layer 172 may be a titanium nitride layer, but it is not limited thereto. In this embodiment, a treatment process P1 may be selectively performed on the bottom barrier layer 172 in the area D, in order to change some chemical or physical properties of the bottom barrier layer 172 in the area D, thereby changing the work function value of the gate electrodes of transistors formed in the area D, and therefore changing the threshold voltage of transistors formed in the area D. In another embodiment, a treatment process P1 may be selectively performed on the bottom barrier layer 172 in the area C, in order to change the threshold voltage of transistors formed in the area C; or, different treatment processes may be performed respectively on the bottom barrier layer 172 in the areas C and D to change the threshold voltage of transistors formed in the areas C and D. As shown in FIG. 5, the treatment process P1 is just depicted in the area D. That means that the treatment process P1 just affects the bottom barrier layer 172 in the area D. In actual practice, a patterned mask (not shown) may cover the area C and expose the area D and the treatment process P1 is performed in the areas C and D, having only the bottom barrier layer 172 in the area D affected by the treatment process P1. Reciprocally, the treatment process P1 may also only affect the bottom barrier layer 172 in the area C.

After the bottom barrier layer 172 is formed on the dielectric layer 164, an etching stop layer (not shown) may be selectively formed on the bottom barrier layer 172, wherein the etching stop layer (not shown) may be a tantalum nitride layer, but it is not limited thereto.

The treatment process P1 comprises an etching process, a doping process, an oxidation process, a nitridation process or a fluoride process, but it is not limited thereto. The treatment process P1 is used to change physical and/or chemical properties of the bottom barrier layer 172, wherein the physical properties may include the thickness, the hardness, the density or the reflectivity of the bottom barrier layer 172, and the chemical properties may include the bonding, the reaction activity or the etching rate of the bottom barrier layer 172. In this way, the physical properties or the chemical properties of the bottom barrier layer 172 can be changed by performing at least a treatment process; the electrical properties, such as the threshold voltage of transistors, can thereby be adjusted. In another way, the treatment process P1 may be performed after the bottom barrier layer 172 is formed, after the etching stop layer (not shown) is formed, or after both of them are formed. In addition, the treatment process of the present invention may be performed after metal layers are formed in subsequent processes.

Figure 6:
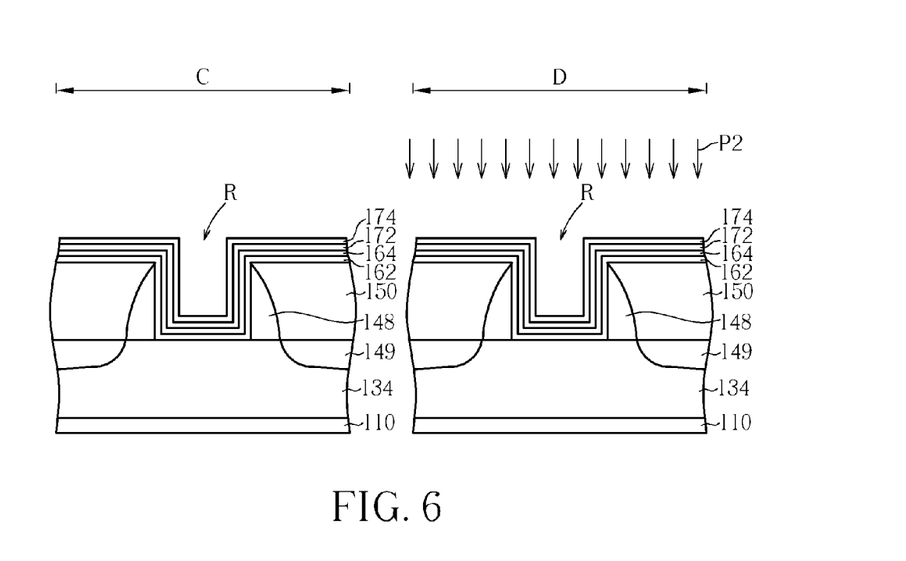

As shown in FIG. 6, a first work function layer 174 is formed on the bottom barrier layer 172, wherein the first work function layer 174 may include a titanium nitride layer or an aluminum titanium layer etc, depending upon electrical types. A treatment process P2 may be selectively performed on the first work function layer 174 in the area D to change the work function value of gate electrodes of transistors formed in the area D, and therefore change the threshold voltage of transistors formed in the area D. Likewise, as shown in FIG. 6, the treatment process P2 is just depicted in the area D. That means the treatment process P2 just affects the first work function layer 174 in the area D. In actual practice, a patterned mask (not shown) may cover the area C and expose the area D and the treatment process P2 is performed in the areas C and D, thereby only the first work function layer 174 in the area D will be affected by performing the treatment process P2. Reciprocally, the treatment process P2 may also only affect the first work function layer 174 in the area C.

The treatment process P2 comprises an etching process, a doping process, an oxidation process, a nitridation process or a fluoride process, but it is not limited thereto. The treatment process P2 is used to change physical and/or chemical properties of the first work function layer 174, wherein the physical properties may include the thickness, the hardness, the density or the reflectivity of the first work function layer 174 and the chemical properties may include the bonding, the reaction activity or the etching rate of the first work function layer 174. In this way, the physical properties or the chemical properties of the first work function layer 174 can be changed by performing at least a treatment process, the electrical performances, such as the threshold voltage of transistors, can thereby be adjusted.

Figure 7:
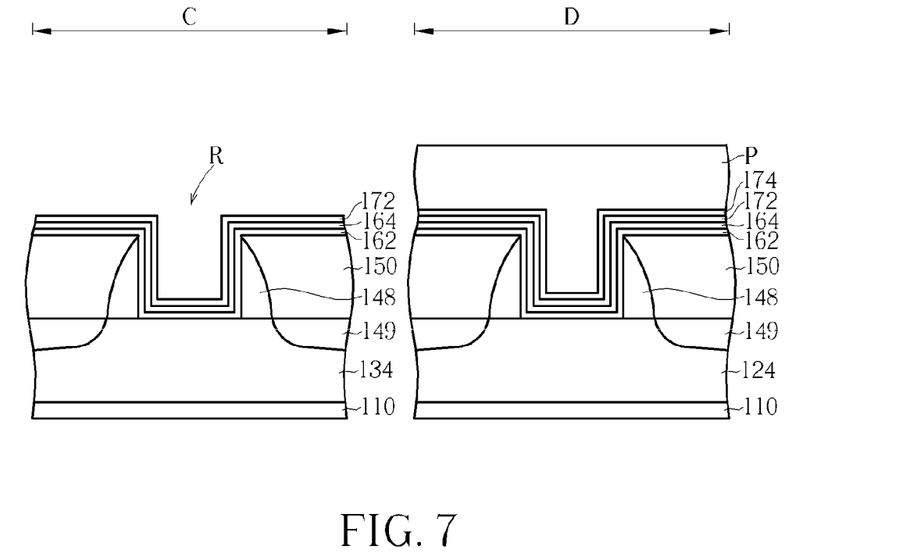
Figure 8:
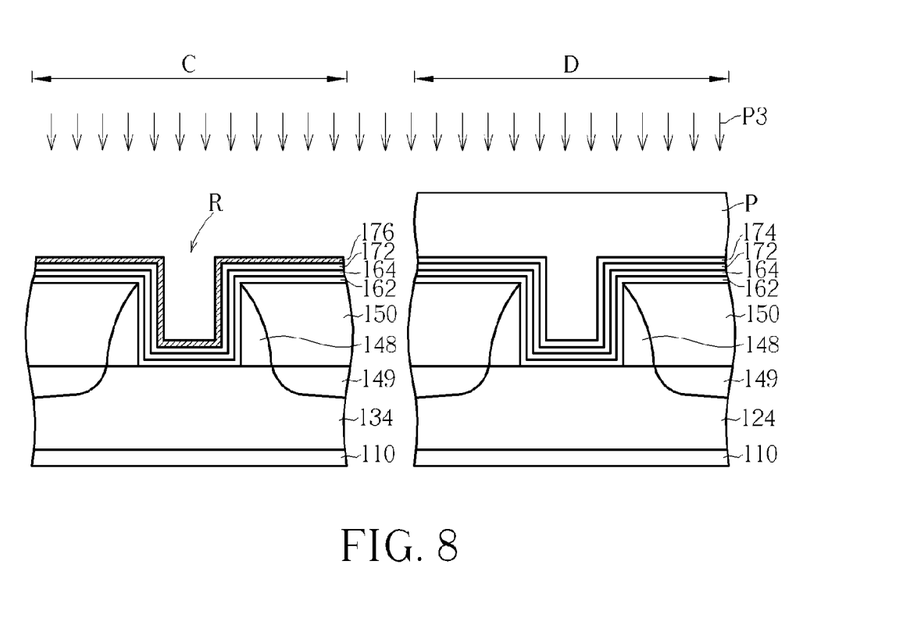

In addition, in another embodiment of the present invention, metal layers such as the work function layers of the first fin-shaped field-effect transistor and the second fin-shaped field-effect transistor may have different materials or may have stacked layer structures, as depicted in FIGS. 7-8. As shown in FIG. 7, a mask layer P is formed and covers the area D to remove the first work function layer 174 in the area C. As shown in FIG. 8, a second work function layer 176 is formed on the bottom barrier layer 172 in the area C. In this embodiment, the second work function layer 176 includes a titanium nitride layer or an aluminum titanium layer, depending upon electrical types. A treatment process P3 may be selectively performed on the second work function layer 176. Due to the mask P covering the area D, the treatment process P3 just affects the second work function layer 176. The treatment process P3 is similar to the treatment process P1 and P2, and is therefore not described again.

In another case, after the first work function layer 174 in the area C is removed as shown in FIG. 7, the mask P is removed. Then, a second work function layer 176 may be formed on the bottom barrier layer 172 in the area C and on the first work function layer 174 in the area D at the same time. Thereafter, a treatment process P3 may be selectively performed on the second work function layer 176 in the area C and/or the area D to change the work function value of transistors formed in the area C and/or the area D, and therefore change the threshold voltage of transistors formed in the area C and/or the area D. The treatment process P3 is similar to the treatment process P1 and P2, and is therefore not described again.

Figure 9:
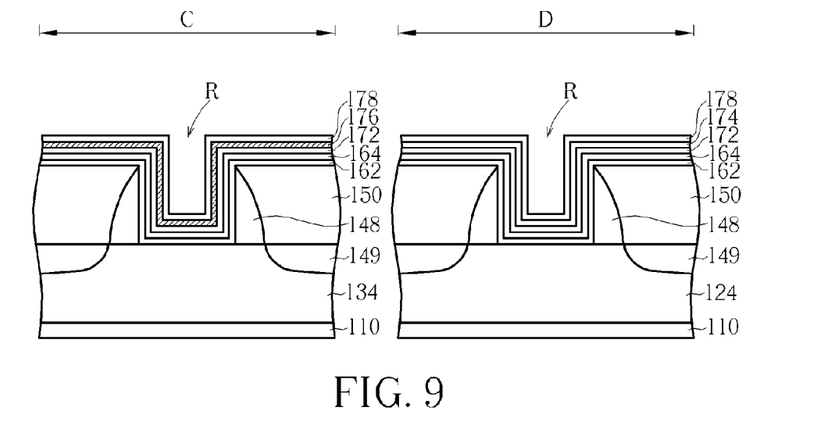
Figure 10:
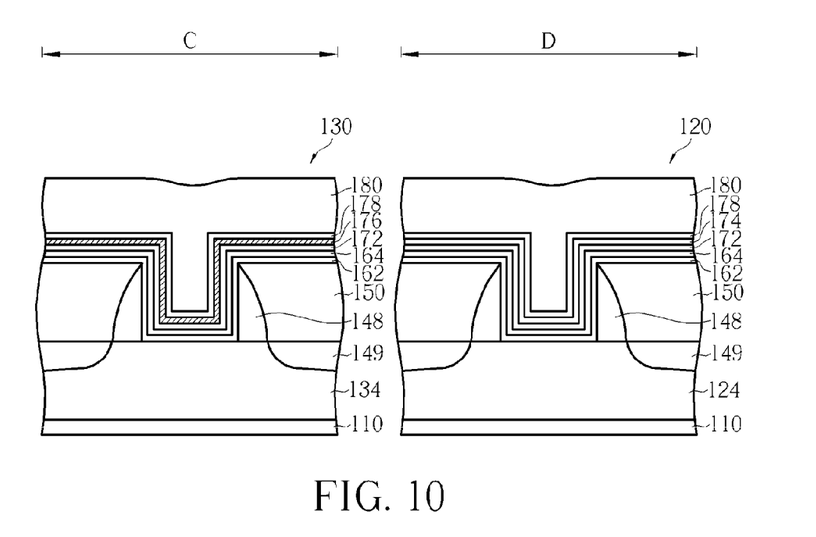

As shown in FIG. 9, a top barrier layer 178 is formed on the second work function layer 176 in the area C and on the first work function layer 174 in the area D at the same time. The top barrier layer 178 may be a titanium nitride layer. As shown in FIG. 10, a low resistivity material 180 is formed on the top barrier layer 178. The low resistivity material 180 may be composed of materials such as aluminum or copper, etc. After the top barrier layer 178 is formed or the low resistivity material 180 is formed, a treatment process (similar to the treatment processes P1, P2 and P3) may be selectively performed to change physical properties and/or chemical properties of the top barrier layer 178 or the low resistivity material 180. Then, metal layers are planarized until the interdielectric layer 150 is exposed, and then subsequent transistor processes may be performed.

To sum up, the first fin-shaped field-effect transistor 120 may include a first metal layer, which includes a stacked metal layer such as a barrier layer (a bottom barrier layer 172 and a top barrier layer 178 for example), a first work function layer 174 and a low resistivity material 180, etc; the second fin-shaped field-effect transistor 130 may include a second metal layer, which includes a stacked metal layer such as a barrier layer (a bottom barrier layer 172 and a top barrier layer 178 for example), a second work function layer 176 and a low resistivity material 180, etc. At least a treatment process is performed in the present invention to change physical or/and chemical properties of at least one of the first metal layers or at least one of the second metal layers. Therefore, the electrical properties of the first fin-shaped field-effect transistor 120 or the second fin-shaped field-effect transistor 130 can be adjusted. For instance, the threshold voltage of the first fin-shaped field-effect transistor 120 or the second fin-shaped field-effect transistor 130 can be adjusted. Specifically, the treatment process comprises an etching process, a doping process, an oxidation process, a nitridation process or a fluoride process, but it is not limited thereto. After the treatment process is performed, the properties of the transistors, such as work function values, volumes, gate leakages, effective current density, etc, can be improved.

It is worth noting that, the first fin-shaped field-effect transistor 120 and the second fin-shaped field-effect transistor 130 all have the same conductivity type in the present invention. Specifically, the first fin-shaped field-effect transistor 120 and the second fin-shaped field-effect transistor 130 may all be N-type transistors or P-type transistors. In other words, the electrical properties, such as the threshold voltage of the fin-shaped field-effect transistors, having the same conductivity type can be changed by performing the treatment process of the present invention, so that the properties of the transistors having the same conductivity type can be adjusted similarly by applying the present invention to reach the requirements of each component.

For example, as shown in FIG. 10, a field-effect transistor can be formed by applying the present invention. The field-effect transistor includes a first fin-shaped field-effect transistor 120 and a second fin-shaped field-effect transistor 130 having the same conductivity type located on a substrate 110. For example, transistors 120 and 130 are both NMOS. For example, transistors 120 and 130 are both PMOS. The first fin-shaped field-effect transistor 120 may include a first metal layer, which may include at least a barrier layer (a bottom barrier layer 172 and a top barrier layer 178 for example), a first work function layer 174 and a low resistivity material 180; the second fin-shaped field-effect transistor 130 may include a second metal layer, which may include at least a barrier layer (a bottom barrier layer 172 and a top barrier layer 178 for example), a second work function layer 176 and a low resistivity material 180.

In one case, a treatment process is performed on at least one of the first metal layer and the second metal layer to change the thickness, so the first metal layer and the second metal layer are of the same material but of different thickness. In another case, a material changing process may be performed on at least one of the first metal layer and the second metal layer to change chemical properties of it, the first metal layer and the second metal layer thereby having different materials.

In addition, the present invention may also be applied to fin-shaped field-effect transistors having different conductivity types. For instance, the first fin-shaped field-effect transistor 120 may be a P-type transistor and the second fin-shaped field-effect transistor 130 may be an N-type transistor. Thus, the first work function layer 174 of the first fin-shaped field-effect transistor 120 may be a titanium nitride layer and the second work function layer 176 of the second fin-shaped field-effect transistor 130 may be an aluminum titanium layer, for pairing with the first fin-shaped field-effect transistor 120 and the second fin-shaped field-effect transistor 130 with different conductivity types, but it is not limited thereto.

In summary, the present invention provides a fin-shaped field-effect transistor and a process thereof, which performs a treatment process on at least one of two or more than two fin-shaped field-effect transistors, to change physical or chemical properties of at least a metal layer in fin-shaped field-effect transistors. Thus, the electrical properties, such as the threshold voltage, of at least one of the fin-shaped field-effect transistors can be improved. Furthermore, the treatment process may include an etching process, a doping process, an oxidation process, a nitridation process or a fluoride process, but it is not limited thereto. The treatment process is used to change physical properties of metal layers, such as the thickness, the hardness, the density or the reflectivity and to change the chemical properties of metal layers such as the bonding, the reaction activity or the etching rate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A field-effect transistor, comprising:
a first fin-shaped field-effect transistor and a second fin-shaped field-effect transistor with the same conductivity type located on a substrate, wherein the first fin-shaped field-effect transistor comprises a buffer layer, a dielectric layer, a bottom barrier layer and a first work function layer all having U-shaped cross-sectional profiles stacked on each other and the second fin-shaped field-effect transistor comprises a buffer layer, a dielectric layer, a bottom barrier layer and a second work function layer all having U-shaped cross-sectional profiles stacked on each other, and the first work function layer and the second work function layer are of the same material but are of different thicknesses.

2. The field-effect transistor according to claim 1, wherein the first fin-shaped field-effect transistor and the second fin-shaped field-effect transistor all further comprise a plurality of metal layers.

3. The field-effect transistor according to claim 2, wherein at least one of the plurality of metal layers of the first fin-shaped field-effect transistor and one of the plurality of metal layers of the second fin-shaped field-effect transistor have different thicknesses.

4. The field-effect transistor according to claim 1, wherein the first fin-shaped field-effect transistor and the second fin-shaped field-effect transistor further comprise a barrier layer, a low resistivity material or a combination of the three.

5. The field-effect transistor according to claim 1, wherein the first fin-shaped field-effect transistor and the second fin-shaped field-effect transistor have different threshold voltages.

6. A field-effect transistor, comprising:
a first fin-shaped field-effect transistor and a second fin-shaped field-effect transistor having the same conductivity type located on a substrate, wherein the first fin-shaped field-effect transistor comprises a buffer layer, a dielectric layer, a bottom barrier layer and a first work function layer all having U-shaped cross-sectional profiles stacked on each other, and the second fin-shaped field-effect transistor comprises a buffer layer, a dielectric layer, a bottom barrier layer and a second work function layer all having U-shaped cross-sectional profiles stacked on each other, and the first work function layer and the second work function layer are of different materials.

7. The field-effect transistor according to claim 6, wherein the first fin-shaped field-effect transistor and the second fin-shaped field-effect transistor all further comprise a plurality of metal layers.

8. The field-effect transistor according to claim 7, wherein at least one of the plurality of metal layers of the first fin-shaped field-effect transistor and one of the plurality of metal layers of the second fin-shaped field-effect transistor have different materials.

9. The field-effect transistor according to claim 6, wherein the first fin-shaped field-effect transistor and the second fin-shaped field-effect transistor all further comprise a barrier layer, a low resistivity material or a combination of the three.

10. The field-effect transistor according to claim 6, wherein the first fin-shaped field-effect transistor and the second fin-shaped field-effect transistor have different threshold voltages.

* * * * *